(12) United States Patent
Lai et al.

(10) Patent No.: US 8,766,307 B2
(45) Date of Patent: Jul. 1, 2014

(54) LIGHT EMITTING DIODE DEVICE

(71) Applicants: Yen-Lin Lai, Tainan (TW); Shen-Jie Wang, Tainan (TW); Yu-Chu Li, Tainan (TW); Jyun-De Wu, Tainan (TW); Ching-Liang Lin, Tainan (TW); Kuan-Yung Liao, Tainan (TW)

(72) Inventors: Yen-Lin Lai, Tainan (TW); Shen-Jie Wang, Tainan (TW); Yu-Chu Li, Tainan (TW); Jyun-De Wu, Tainan (TW); Ching-Liang Lin, Tainan (TW); Kuan-Yung Liao, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/778,161

(22) Filed: Feb. 27, 2013

(65) Prior Publication Data

US 2013/0277697 A1 Oct. 24, 2013

(30) Foreign Application Priority Data

Apr. 18, 2012 (TW) .............................. 101113822 A

(51) Int. Cl.
*H01L 33/60* (2010.01)
(52) U.S. Cl.
USPC .................. 257/98; 257/99; 257/E33.074
(58) Field of Classification Search
CPC . H01L 33/20; H01L 33/60; H01L 2933/0091; H01L 2933/0083; H01L 33/46; H01L 33/58
USPC .............................. 257/79, 98–100, E33.074
See application file for complete search history.

(56) References Cited

U.S. PATENT DOCUMENTS

| 8,154,034 | B1* | 4/2012 | Zhang et al. | 257/90 |
| 8,253,327 | B2* | 8/2012 | Ibe et al. | 313/512 |
| 8,384,601 | B2* | 2/2013 | Hanaoka et al. | 343/700 MS |
| 2012/0049179 | A1* | 3/2012 | Kuo et al. | 257/43 |
| 2013/0313597 | A1* | 11/2013 | Dai et al. | 257/98 |

FOREIGN PATENT DOCUMENTS

| TW | 535300 | 6/2003 |
| TW | 200518413 | 6/2005 |
| TW | 200717876 | 5/2007 |
| TW | M394576 | 12/2010 |

OTHER PUBLICATIONS

"Office Action of Taiwan Counterpart Application", issued on Jan. 28, 2014, p. 1-p. 6, Application No. 101113822.

* cited by examiner

*Primary Examiner* — Tuan N. Quach
(74) *Attorney, Agent, or Firm* — Jianq Chyun IP Office

(57) ABSTRACT

A light emitting diode device includes an epitaxial substrate, at least one passivation structure, at least one void, a semiconductor layer, a first type doping semiconductor layer, a light-emitting layer and a second type doping semiconductor layer. The passivation structure is disposed on the epitaxial substrate and has an outer surface. The void is located at the passivation structure and at least covering 50% of the outer surface of the passivation structure. The semiconductor layer is disposed on the epitaxial substrate and encapsulating the passivation structure and the void. The first type doping semiconductor layer is disposed on the semiconductor layer. The light-emitting layer is disposed on the first type doping semiconductor layer. The second type doping semiconductor layer is disposed on the light emitting layer.

13 Claims, 5 Drawing Sheets

LIGHT EMITTING DIODE DEVICE

CROSS-REFERENCE TO RELATED APPLICATION

This application claims the priority benefit of Taiwan application serial no. 101113822, filed on Apr. 18, 2012. The entirety of the above-mentioned patent application is hereby incorporated by reference herein and made a part of this specification.

BACKGROUND

1. Field of the Invention

The invention relates an illumination device, and more particularly to, a light emitting diode device.

2. Description of Related Art

Light emitting diode is usually composed of semiconductor materials containing groups III-V elements, and the light emitting diode has the ability of converting electrical energy into light. The luminescence of the light emitting diode belongs to cold luminescence; therefore, the light emitting diode has the advantages of fast response, small size, power-saving, and difficult to break, and thus the application field thereof is very broad.

The gallium nitride based (GaN-based) semiconductor material has been proven to have a great potential in the application of producing the light emitting diode, and the coverage of the light emitting wavelength thereof may range from infrared light, visible light, and to ultraviolet light. Therefore, GaN-based semiconductor is increasingly valued by the majority in the recent years.

The conventional gallium nitride light emitting diode usually uses sapphire as epitaxial substrate. However, the sapphire is transparent material, causing light emitted by the light emitting diode to scatter around, incapable of concentrated utilization, and thereby reducing the light emitting efficiency of the light emitting diode. Furthermore, since refractive index of outside air and the gallium nitride material differs about 1.5, light generated by the light-emitting layer of the light emitting diode is totally reflected by the interface of the gallium nitride and the outside air, thus being limited in the internal of the light emitting diode, so that the light emitting efficiency of the light emitting diode is reduced.

SUMMARY OF THE INVENTION

The invention provides a light emitting diode device with a better light emitting efficiency.

The invention provides a light emitting diode device comprising an epitaxial substrate, at least one passivation structure, at least one void, a semiconductor layer, a first type doping semiconductor layer, a light-emitting layer, and a second type doping semiconductor layer. The passivation structure is disposed on the epitaxial substrate and has an outer surface. The void is located on the passivation structure and at least covering 50% of the outer surface of the passivation structure. The semiconductor layer is disposed on the epitaxial substrate and encapsulating the passivation structure and the void. The first type doping semiconductor layer is disposed on the semiconductor layer. The light-emitting layer is disposed on the first type doping semiconductor layer. The second type doping semiconductor layer is disposed on the light-emitting layer.

In an exemplary embodiment, a material of the passivation structure is silicon dioxide or aluminium nitride.

In an exemplary embodiment, the at least one passivation structure is a plurality of passivation structures, and the at least one void is a plurality of voids. The passivation structures are not connected to each other and are arranged with equal spacing on the epitaxial substrate, and the voids are respectively located on the passivation structures.

In an exemplary embodiment, the spacing between two adjacent passivation structures is somewhere in between 1.5 microns to 3.5 microns.

In an exemplary embodiment, the coverage rate of the outer surfaces of the passivation structures covering by the voids is less than an outer diameter/spacing ratio of each of the passivation structures.

In an exemplary embodiment, the outer diameter of the passivation structure is somewhere in between 1.3 microns to 2.8 microns.

In an exemplary embodiment, the height of the passivation structure is somewhere in between 0.5 microns to 2.0 microns.

In an exemplary embodiment, the cross-sectional appearance of the passivation structure comprises rectangle, semicircle, triangle, trapezoid, bullet-shape, dome-shape, wavy-shape, or zigzag-shape.

In an exemplary embodiment, the passivation structure comprises a protrusion portion and a passivation layer. The protrusion portion is disposed on the epitaxial substrate. The passivation layer is disposed on at least one side of the protrusion portion and in contract with the protrusion portion. A material of the protrusion portion is sapphire, and a material of the passivation layer is silicon dioxide or aluminium nitride.

In an exemplary embodiment, the passivation layer is encapsulating the protrusion portion.

In an exemplary embodiment, the cross-sectional appearance of the protrusion portion comprises rectangle, semicircle, triangle, trapezoid, bullet-shape, dome-shape, wavy-shape, or zigzag-shape, and the passivation structure and the protrusion portion are conformally disposed.

In an exemplary embodiment, the epitaxial substrate is a sapphire substrate.

In an exemplary embodiment, the first type doping semiconductor layer is N type doping semiconductor layer, and the second type doping semiconductor layer is P type doping semiconductor layer.

In an exemplary embodiment, materials of the first type doping semiconductor layer and the second type doping semiconductor layer are composed of doping at least one of gallium nitride, aluminium gallium nitride, InGaN, AlInGaN with the group II or group IV element.

In an exemplary embodiment, the light emitting diode device further comprises a first electrode and a second electrode. The first electrode is disposed on the first type doping semiconductor layer and electrically connected with the first type doping semiconductor layer. The second electrode is disposed on the second type doping semiconductor layer and electrically connected with the second type doping semiconductor layer.

According to the above, since the light emitting diode device of the invention has the void located on the passivation structure and both the passivation structure and the void are encapsulated inside the semiconductor layer, the void located on the outer surface of the passivation structure may produce good scatter effect when the light generated by the light-emitting layer is emitted into the passivation structure, thus enhancing the light emitting efficiency of the light emitting diode device. Furthermore, since the void may easily cause the light emitted from the light-emitting layer to produce a total reflection, and the light is emitted out of the light emitting diode device after being totally reflected, and thus the light emitting efficiency of the light emitting diode device is enhanced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
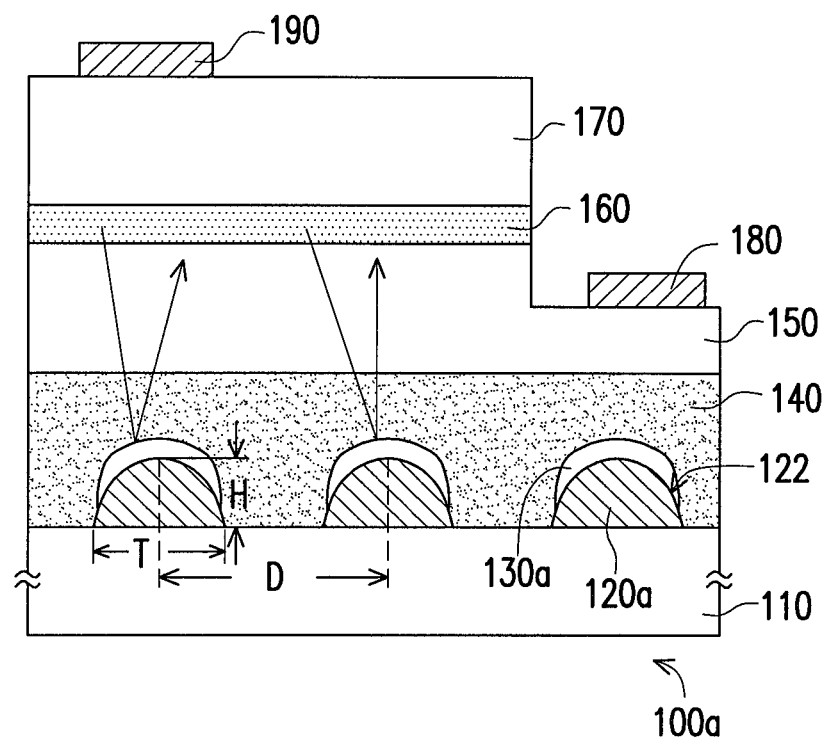
FIG. 1A a schematic cross-sectional view illustrating a light emitting diode device in accordance with an embodiment of the invention.

FIG. 1A a schematic cross-sectional view illustrating a light emitting diode device in accordance with an embodiment of the invention. With reference to FIG. 1A, in the present embodiment, the light emitting diode device 100a includes an epitaxial substrate 110, at least one passivation structure 120a (a plurality is schematically shown in FIG. 1A), at least one void 130a (a plurality is schematically shown in FIG. 1A), a semiconductor layer 140, a first type doping semiconductor layer 150, a light-emitting layer 160, and a second type doping semiconductor layer 170. Herein, the epitaxial substrate 110 is, for example, a sapphire substrate.

In detail, the passivation structures 120a are disposed on the epitaxial substrate 110, wherein the passivation structures 120a are not connected to each other, and are arranged with equal spacing on the epitaxial substrate 110. Herein, considering also the subsequent epitaxial quality and process yield, preferably, the spacing D between two adjacent passivation structures 120a is, for example, somewhere in between 1.5 microns to 3.5 microns. The outer diameter T of the passivation structures 120a is, for example, somewhere in between 1.3 microns to 2.8 microns, and the height H of the passivation structures 120a is, for example, somewhere in between 0.5 microns to 2.0 microns. The voids 130a are respectively located on the passivation structures 120a and covering the outer surfaces 122 of the passivation structures 120a, wherein the voids 130a are covering at least 50% of the outer surfaces 122 of the passivation structures 120a. As shown in FIG. 1A, the voids 130a are not fully covering the passivation structures 120a, such that the voids 130a are only covering approximately 70% of the outer surfaces 122 of the passivation structures 120a. Herein, the appearance of each passivation structures 120a is, for example, bullet-shaped, and the voids 130a shown in a uniform and continuous state are respectively covering the outer surface 122 of each passivation structures 120a. Specifically, a material of the passivation structures 120a is silicon dioxide or aluminium nitride, and the coverage rate of the outer surfaces 122 of the passivation structures 120a covering by the voids 130a is less than an outer diameter T/spacing D ratio of each of the passivation structures 120a.

The semiconductor layer 140 is disposed on the epitaxial substrate 110 and encapsulating the passivation structures 120a and the voids 130a. The first type doping semiconductor layer 150 is disposed on the semiconductor layer 140. The light-emitting layer 160 is disposed on the first type doping semiconductor layer 150. The second type doping semiconductor layer 170 is disposed on the light-emitting layer 160. Herein the first type doping semiconductor layer 150 is N type doping semiconductor layer, and the second type doping semiconductor layer 170 is P type doping semiconductor layer. Materials of the first type doping semiconductor layer 150 and the second type doping semiconductor layer 170 are, for example, composed of doping at least one of gallium nitride, aluminium gallium nitride, InGaN, AlInGaN with the group II or group IV element. In addition, the light emitting diode device 100a of the present embodiment further includes a first electrode 180 and a second electrode 190. The first electrode 180 is disposed on the first type doping semiconductor layer 150 and electrically connected with the first type doping semiconductor layer 150, and the second electrode 190 is disposed on the second type doping semiconductor layer 170 and electrically connected with the second type doping semiconductor layer 170.

Since the light emitting diode device 100a of the present embodiment has the voids 130a located on the passivation structures 120a and all the passivation structures 120a and the voids 130a are encapsulated inside the semiconductor layer 140, the voids 130a located on the outer surfaces 122 of the passivation structures 120a may produce good scatter effect when the light (referring to the arrow direction in FIG. 1A) generated by the light-emitting layer 160 is emitted into the passivation structures 120a, thus enhancing the light emitting efficiency of the light emitting diode device 100a. Furthermore, since the voids 130a may easily cause the light emitted from the light-emitting layer 160 to produce a total reflection, and the light is emitted out of the light emitting diode device 100a after being totally reflected, and thus the light emitting efficiency of the light emitting diode device 100a is enhanced.

Figure 1B:
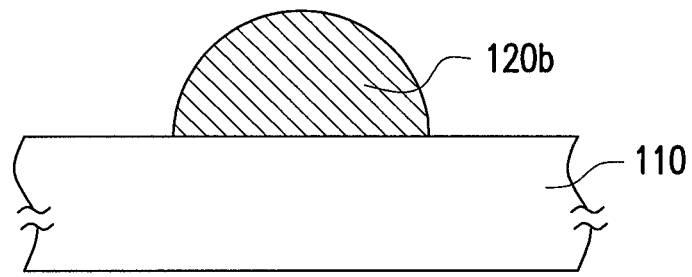
FIG. 1B a schematic cross-sectional view illustrating another implementation of a passivation structure in FIG. 1A.
Figure 1C:
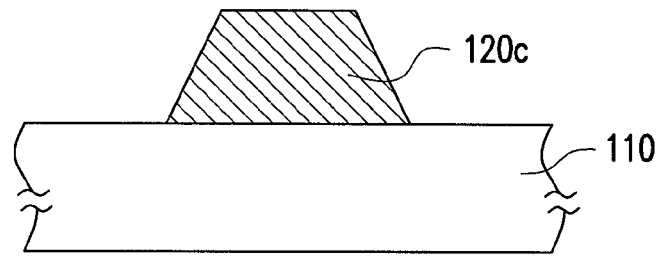
FIG. 1C a schematic cross-sectional view illustrating another implementation of a passivation structure in FIG. 1A.
Figure 1D:
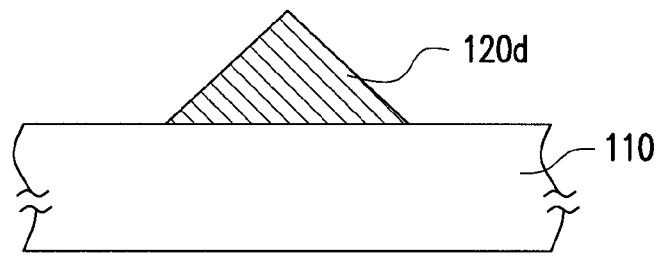
FIG. 1D is a schematic cross-sectional view illustrating another implementation of a passivation structure in FIG. 1A.
Figure 1E:
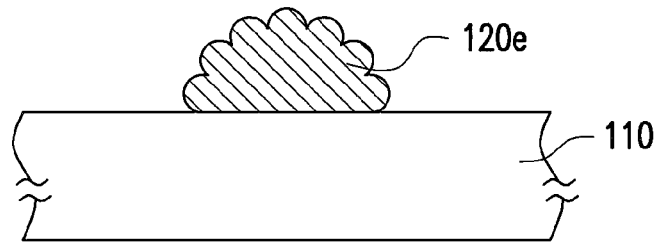
FIG. 1E is a schematic cross-sectional view illustrating another implementation of a passivation structure in FIG. 1A.
Figure 1F:
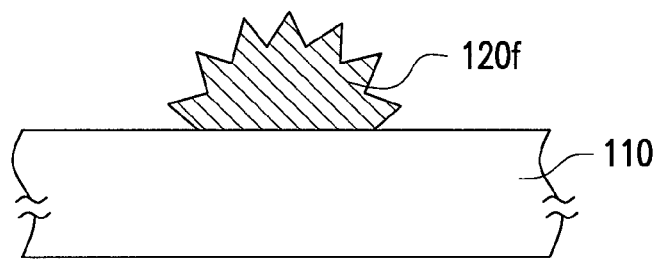
FIG. 1F is a schematic cross-sectional view illustrating another implementation of a passivation structure of FIG. 1A.

It is noted that the invention is not limited to the appearance of the passivation structure 120a, even though herein the reification of the cross-sectional appearance of the passivation structure 120a is bullet-shaped. Nevertheless, in the alternative exemplary embodiments, referring to FIG. 1B, the cross-sectional appearance of a passivation structure 120b may also be semicircular; referring to FIG. 1C, the cross-sectional appearance of a passivation structure 120c may also be trapezoidal; referring to FIG. 1D, the cross-sectional appearance of a passivation structure 120d may also be triangular; referring to FIG. 1E, the cross-sectional appearance of a passivation structure 120e may also be wavy-shaped; referring to FIG. 1F, the cross-sectional appearance of a passivation structure 120f may also be zigzag-shaped; or referring to another alternative embodiment (not shown), the cross-sectional appearance of the passivation structure may also be dome-shaped. Therefore, the cross-sectional appearance of the passivation structure 120a shown in FIG. 1A is only taken as an example for illustrating the descriptions, and the invention is not limited hereto.

The following exemplary embodiments adopt the element symbols and parts of the contents from the above-mentioned embodiments, wherein same symbols are being used to indicate the same or similar elements, and the description for the contents of the same technology is therefore omitted. The descriptions of the omitted parts may be referred to the above-mentioned embodiments, so that detailed descriptions thereof are not repeated.

Figure 2:
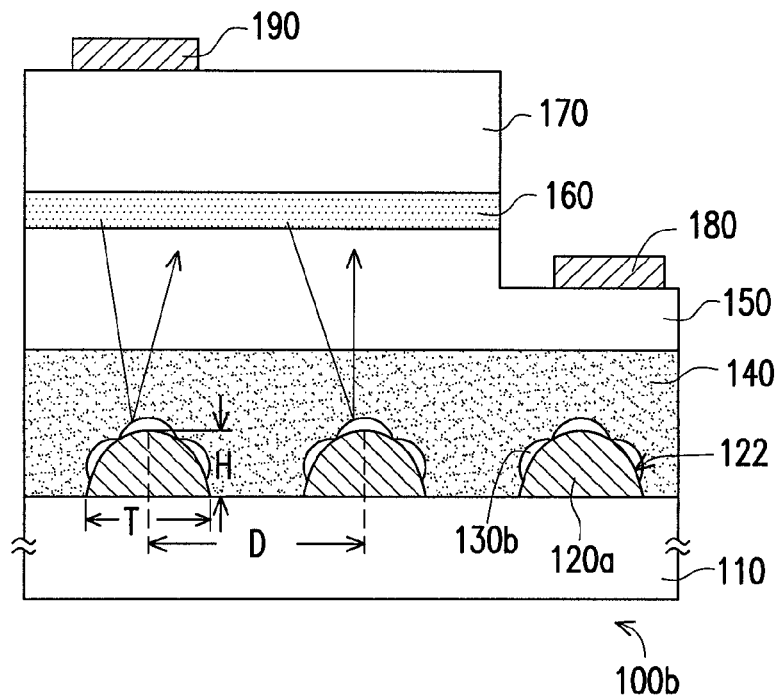
FIG. 2 is a schematic diagram illustrating a light emitting diode device in accordance with an embodiment of the invention.

FIG. 2 is a schematic diagram illustrating a light emitting diode device in accordance with an embodiment of the invention. The light emitting diode device 100b of the present embodiment is the same as the light emitting diode device 100a in FIG. 1A, the difference is only that: the voids 130b of the present embodiment are in a non-uniform and continuous state. Therefore when the light (referring to the arrow direction in FIG. 2) generated by the light-emitting layer 160 is emitted into the passivation structure 120a, the probability of producing total reflection by emitting into the passivation structure 120a at any angle may be increased, thus enhancing the overall light emitting efficiency of the light emitting diode device 100b.

Figure 3:
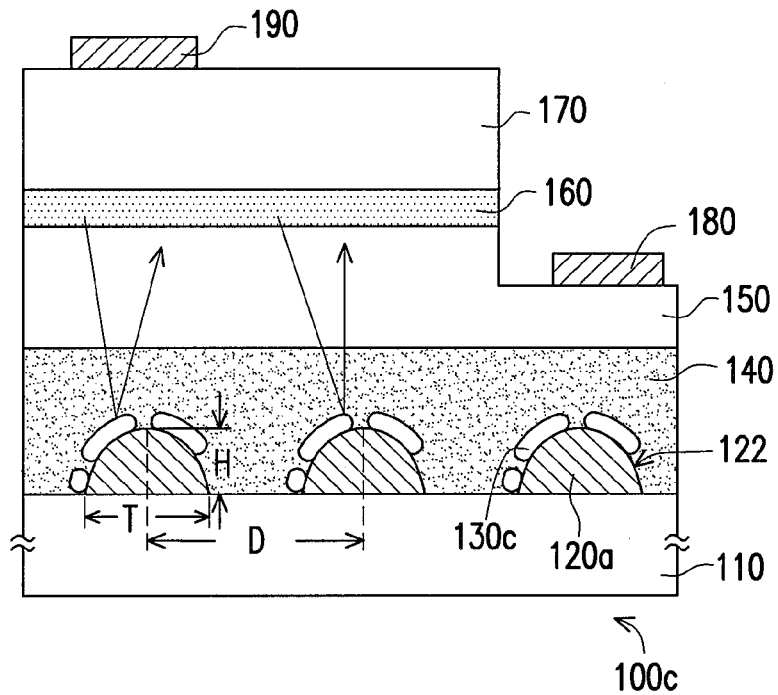
FIG. 3 is a schematic diagram illustrating a light emitting diode device in accordance with an embodiment of the invention.

FIG. 3 is a schematic diagram illustrating a light emitting diode device in accordance with an embodiment of the invention. The light emitting diode device 100c of the present embodiment is the same as the light emitting diode device 100a in FIG. 1A, the difference is only that: the voids 130c of the embodiment are in a non-uniform and discontinuous state. Therefore when the light (referring to the arrow direction in FIG. 3) generated by the light-emitting layer 160 is emitted into the passivation structure 120a, the probability of producing total reflection by emitting into the passivation structure 120a at any angle may be increased, and the probability of producing reflection and scattering may also be increased, thus enhancing the overall light emitting efficiency of the light emitting diode device 100c.

Figure 4:
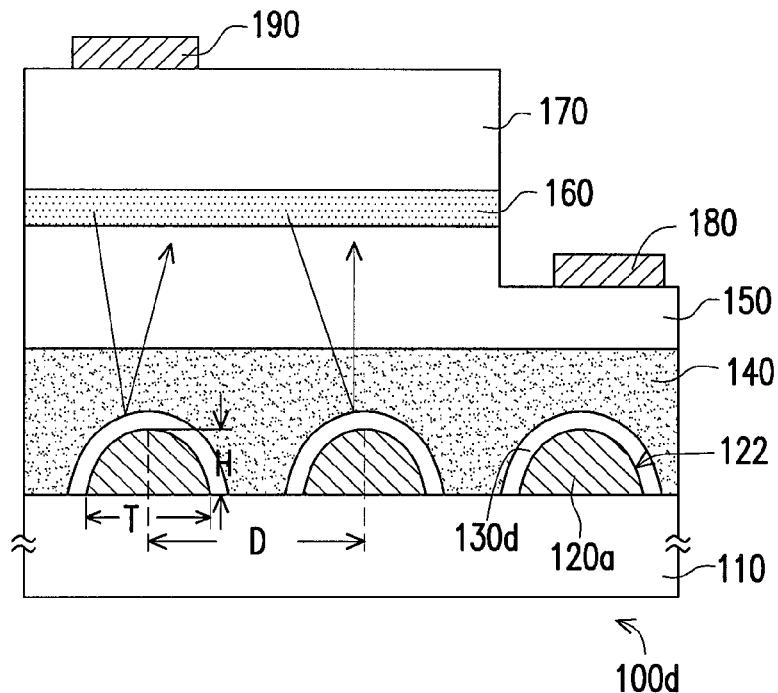
FIG. 4 is a schematic diagram illustrating a light emitting diode device in accordance with an embodiment of the invention.

FIG. 4 is a schematic diagram illustrating a light emitting diode device in accordance with an embodiment of the invention. The light emitting diode device 100d of the present embodiment is the same as the light emitting diode device 100a in FIG. 1A, the difference is only that: the voids 130d of the present embodiment are in a uniform and continuous state and completely covering the passivation structure 120a. Therefore when the light (referring to the arrow direction in FIG. 4) generated by the light-emitting layer 160 is emitted into the passivation structure 120a, the probability of producing total reflection and scattering by emitting into the passivation structure 120a at any angle may be increased, thus enhancing the overall light emitting efficiency of the light emitting diode device 100d.

Figure 5:
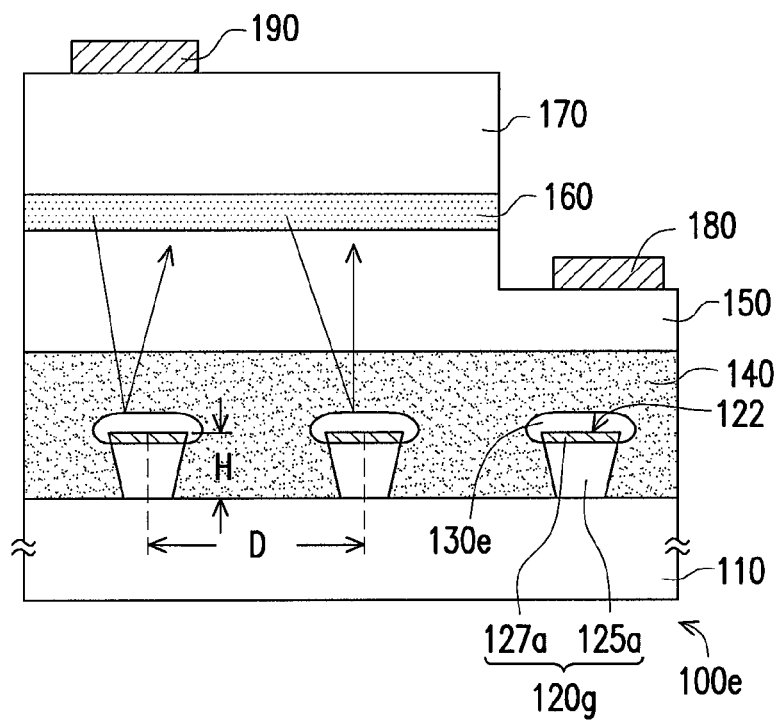
FIG. 5 is a schematic diagram illustrating a light emitting diode device in accordance with an embodiment of the invention.

FIG. 5 is a schematic diagram illustrating a light emitting diode device in accordance with an embodiment of the invention. The light emitting diode device 100e of the present embodiment is the same as the light emitting diode device 100a in FIG. 1A, the difference is only that: each passivation structure 120g of the light emitting diode device 100e of the present embodiment includes a protrusion portion 125a and a passivation layer 127a, wherein the protrusion portion 125a is disposed on the epitaxial substrate 110. Herein, the appearance of the protrusion portion 125a is, for example, trapezoidal, and the passivation layer 127a is disposed on at least one side of the protrusion portion 125a and in contact with the protrusion portion 125a. Herein, the passivation layer 127a is only located at the apex of the protrusion portion 125a, and each void 130e is in a uniform and continuous state and completely covering the passivation layer 127a of each passivation structure 120g. Consequently, in other present embodiments (not shown), the cross-sectional appearance of the protrusion portion 125a may also be rectangular, semicircular, triangular, trapezoidal, bullet-shaped, dome-shaped, wavy-shaped, or zigzag-shaped, and the invention is not limited hereto. In addition, a material of the protrusion portion 125a is, for example, sapphire, and a material of the passivation layer 127a is, for example, silicon dioxide or aluminium nitride. It is noted that the embodiment is not limited to the form of the voids 130e, an in other present embodiments (not shown), the forms of the voids 130e may also be the forms, such as the voids 130a, 130b, and 130c, in the aforementioned embodiments.

Figure 6:
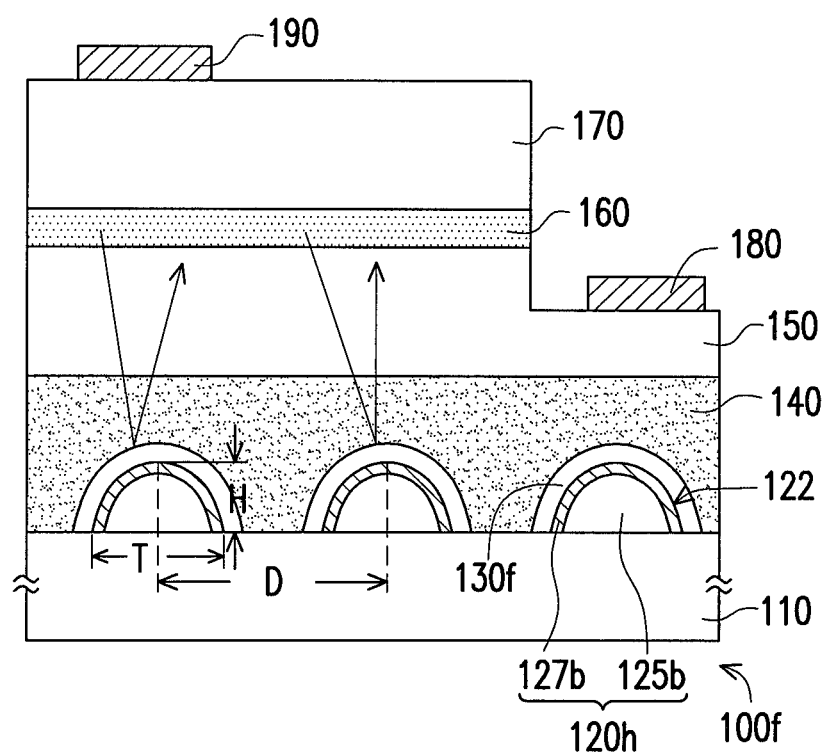
FIG. 6 is a schematic diagram illustrating a light emitting diode device in accordance with an embodiment of the invention.

FIG. 6 is a schematic diagram illustrating a light emitting diode device in accordance with an embodiment of the invention. The light emitting diode device 100f of the present embodiment is the same as the light emitting diode device 100e in FIG. 5, the difference is only that: each passivation structure 120h of the light emitting diode device 100f of the present embodiment includes a protrusion portion 125b and a passivation layer 127b, wherein the protrusion portion 125b is disposed on the epitaxial substrate 110, the passivation layer 127b is completely encapsulating the protrusion portion 125b, and each void 130f is completely covering the passivation structure 120g. Herein the appearance of the protrusion portion 125b is, for example, bullet-shaped.

According to the forgoing, since the light emitting diode device of the invention has the void located on the passivation structure and both the passivation structure and the void are encapsulated inside the semiconductor layer, the void located on the outer surface of the passivation structure may produce a good scatter effect when the light generated by the light-emitting layer is emitted into the passivation structure, thus enhancing the light emitting efficiency of the light emitting diode device. Furthermore, since the void may easily cause the light emitted from the light-emitting layer to produce a total reflection, and the light is emitted out of the light emitting diode device after being totally reflected, and thus the light emitting efficiency of the light emitting diode device is enhanced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting diode device comprising:
   an epitaxial substrate;
   at least one passivation structure disposed on the epitaxial substrate and having an outer surface, wherein the passivation structure comprises a protrusion portion and a passivation layer, the protrusion portion is disposed on the epitaxial substrate, the passivation layer is disposed on at least one side of the protrusion portion and in contact with the protrusion portion, a material of the protrusion portion is sapphire, and a material of the passivation layer is silicon dioxide or aluminium nitride;

at least one void located on the passivation structure and at least covering 50% of the outer surface of the passivation structure;

a semiconductor layer disposed on the epitaxial substrate and encapsulating the passivation structure and the void;

a first type doping semiconductor layer disposed on the semiconductor layer;

a light-emitting layer disposed on the first type doping semiconductor layer; and a second type doping semiconductor layer disposed on the light-emitting layer.

2. The light emitting diode device as recited in claim 1, wherein the at least one passivation structure is a plurality of passivation structures, the at least one void is a plurality of voids, the passivation structures are not connected to each other and are arranged with equal spacing on the epitaxial substrate, and the voids are respectively located on the passivation structures.

3. The light emitting diode device as recited in claim 2, wherein the spacing between two adjacent passivation structures is somewhere in between 1.5 microns to 3.5 microns.

4. The light emitting diode device as recited in claim 2, wherein the coverage rate of the outer surfaces of the passivation structures covering by the voids is less than an outer diameter/spacing ratio of each of the passivation structures.

5. The light emitting diode device as recited in claim 1, wherein the outer diameter of the passivation structure is somewhere in between 1.3 microns to 2.8 microns.

6. The light emitting diode device as recited in claim 1, wherein the height of the passivation structure is somewhere in between 0.5 microns to 2.0 microns.

7. The light emitting diode device as recited in claim 1, wherein the cross-sectional appearance of the passivation structure comprises rectangle, semicircle, triangle, trapezoid, bullet-shape, dome-shape, wavy-shape, or zigzag-shape.

8. The light emitting diode device as recited in claim 1, wherein the passivation layer is encapsulating the protrusion portion.

9. The light emitting diode device as recited in claim 1, wherein the cross-sectional appearance of the protrusion portion comprises rectangle, semicircle, triangle, trapezoid, bullet-shape, dome-shape, wavy-shape, or zigzag-shape, and the passivation structure and the protrusion portion are conformally disposed.

10. The light emitting diode device as recited in claim 1, wherein the epitaxial substrate is a sapphire substrate.

11. The light emitting diode device as recited in claim 1, wherein the first type doping semiconductor layer is N type doping semiconductor layer, and the second type doping semiconductor layer is P type doping semiconductor layer.

12. The light emitting diode device as recited in claim 1, wherein materials of the first type doping semiconductor layer and the second type doping semiconductor layer are composed of doping at least one of gallium nitride, aluminium gallium nitride, InGaN, AlInGaN with the group II or group IV element.

13. The light emitting diode device as recited in claim 1 further comprising:

a first electrode disposed on the first type doping semiconductor layer and electrically connected with the first type doping semiconductor layer; and a second electrode disposed on the second type doping semiconductor layer and electrically connected with the second type doping semiconductor layer.

* * * * *